(12) United States Patent
Chinthakindi et al.

(10) Patent No.: US 7,816,762 B2
(45) Date of Patent: Oct. 19, 2010

(54) ON-CHIP DECOUPLING CAPACITOR STRUCTURES

(75) Inventors: Anil K. Chinthakindi, Haymarket, VA (US); Eric Thompson, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 472 days.

(21) Appl. No.: 11/834,956

(22) Filed: Aug. 7, 2007

(65) Prior Publication Data

US 2009/0039467 A1 Feb. 12, 2009

(51) Int. Cl.
*H01L 29/00* (2006.01)
(52) U.S. Cl. .................. 257/534; 257/303; 257/306; 257/310; 257/500; 257/E29.346; 438/239; 438/244; 438/253; 438/396
(58) Field of Classification Search .................. None
See application file for complete search history.

(56) References Cited

U.S. PATENT DOCUMENTS

| | | | |
|---|---|---|---|
| 3,862,017 A | 1/1975 | Tsunemitsu et al. | |
| 4,961,104 A | 10/1990 | Hirakawa | |
| 5,275,963 A | 1/1994 | Cederbaum et al. | |
| 5,298,782 A | 3/1994 | Sundaresan | |
| 5,939,766 A | 8/1999 | Stolmeijer et al. | |
| 6,225,657 B1 * | 5/2001 | Saeki | 257/296 |
| 6,500,724 B1 | 12/2002 | Zurcher et al. | |
| 6,700,203 B1 | 3/2004 | Cabral, Jr. et al. | |
| 6,956,261 B2 * | 10/2005 | Shibata | 257/306 |
| 7,195,971 B2 | 3/2007 | Bernstein et al. | |
| 7,276,751 B2 * | 10/2007 | Ho et al. | 257/296 |
| 2007/0123015 A1 | 5/2007 | Chinthakindi et al. | |

* cited by examiner

*Primary Examiner*—Zandra Smith
*Assistant Examiner*—Khanh B Duong
(74) *Attorney, Agent, or Firm*—Ohlandt, Grealey, Ruggiero & Perle, LLP; Joseph P. Abate

(57) ABSTRACT

The present disclosure provides on-chip decoupling capacitor structures having trench capacitors integrated with planar capacitors to provide an improved overall capacitance density. In some embodiments, the structure includes at least one deep trench capacitor, at least one planar capacitor, and a metal layer interconnecting said deep trench and planar capacitors. In other embodiments, the structure includes at least one deep trench capacitor and a metal layer in electrical communication with the at least one deep trench capacitor. The at least one deep trench capacitor has a shallow trench isolation region, a doped region, an inner electrode, and a dielectric between the doped region and the inner electrode. The dielectric has an upper edge that terminates at a lower surface of the shallow trench isolation region.

18 Claims, 2 Drawing Sheets

ON-CHIP DECOUPLING CAPACITOR STRUCTURES

BACKGROUND OF INVENTION

The present disclosure relates to integrated circuit (IC) structures in complementary metal oxide semiconductor (CMOS) circuits. More particularly, the present disclosure relates to on-chip decoupling capacitor structures having trench decoupling capacitors integrated with a planar decoupling capacitors.

One goal for semiconductor designers is to design highly reliable, super high performance CMOS circuits with ever increasing functionality requirements, while consuming the lowest possible power. This becomes more important for low power battery operated devices where battery-operating lifetime is crucial.

In this mode of operation, circuit designers face a number of challenges to insure high signal integrity within the chip and the semiconductor package. Simultaneous switching through the input and output (I/O) pins give to current "noise" spike within a specified time, severely degrading the signal integrity. The signal integrity is jeopardized mainly by the "noise" on the power and ground planes due to the capacitance coupling between power and signal lines.

To insure the system reliability against such deleterious effects, decoupling capacitors, known as DECAPS, are added to the power and ground planes to provide an AC ground for the noise and provide a stable DC voltage.

One currently methodology for embedding a DECAP on a microprocessor is to use a planar gate oxide in conjunction with available structures in the semiconductor process flow. For example, planar gate oxides have been used to form N-type decoupling capacitors, known as NCAPS, and P-type decoupling capacitors, known as PCAPS, metal-oxide-silicon capacitors (MOSCAP), and others. The capacitance of such planar DECAPS strongly depends on the thickness of the gate oxide. Thus, planar DECAPS are formed on the surface of the device. Unfortunately, current planar DECAPS offer higher leakage current and lower capacitance density, leading to larger chip sizes, lower performance, and higher cost.

Another current methodology for embedding a DECAP on a microprocessor is to form a trench-type capacitor that is made directly in the silicon wafer and the sidewalls of the trench are used for the capacitor dielectric. Such trench-type capacitors offer higher capacitance densities over the planar capacitors and lower leakage current. Unfortunately, the area density of deep trench DECAPS is limited by the thickness of the substrate.

However, there is a continuing need in the integrated circuit industry for increased decoupling capacitance beyond that currently available.

BRIEF DESCRIPTION OF THE INVENTION

The present disclosure provides on-chip decoupling capacitor structures having trench capacitors integrated with planar capacitors to provide an improved overall capacitance density.

An on-chip decoupling capacitor structure is provided that includes at least one deep trench capacitor, at least one planar capacitor, and a metal layer interconnecting the deep trench and planar capacitors.

An on-chip decoupling capacitor structure is also provided that includes at least one deep trench capacitor and a metal layer in electrical communication with the at least one deep trench capacitor. The at least one deep trench capacitor has a shallow trench isolation region, a doped region, an inner electrode, and a dielectric between the doped region and the inner electrode. The dielectric has an upper edge that terminates at a lower surface of the shallow trench isolation region.

The above-described and other features and advantages of the present disclosure will be appreciated and understood by those skilled in the art from the following detailed description, drawings, and appended claims.

DETAILED DESCRIPTION OF THE INVENTION

Figure 1:
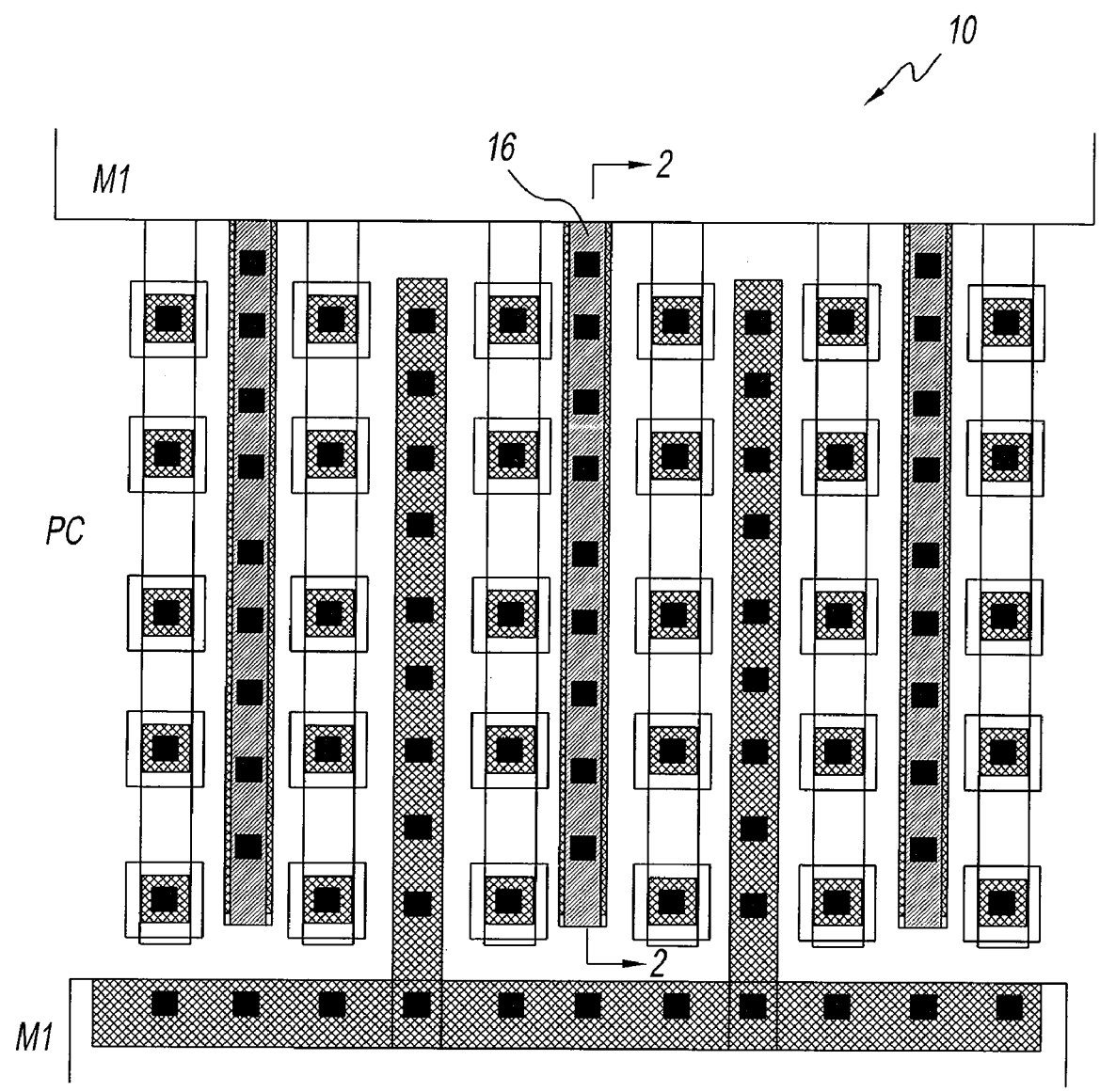
FIG. 1 is a top view of a first exemplary embodiment of a complementary metal oxide semiconductor (CMOS) circuit according to the present disclosure.
Figure 2:
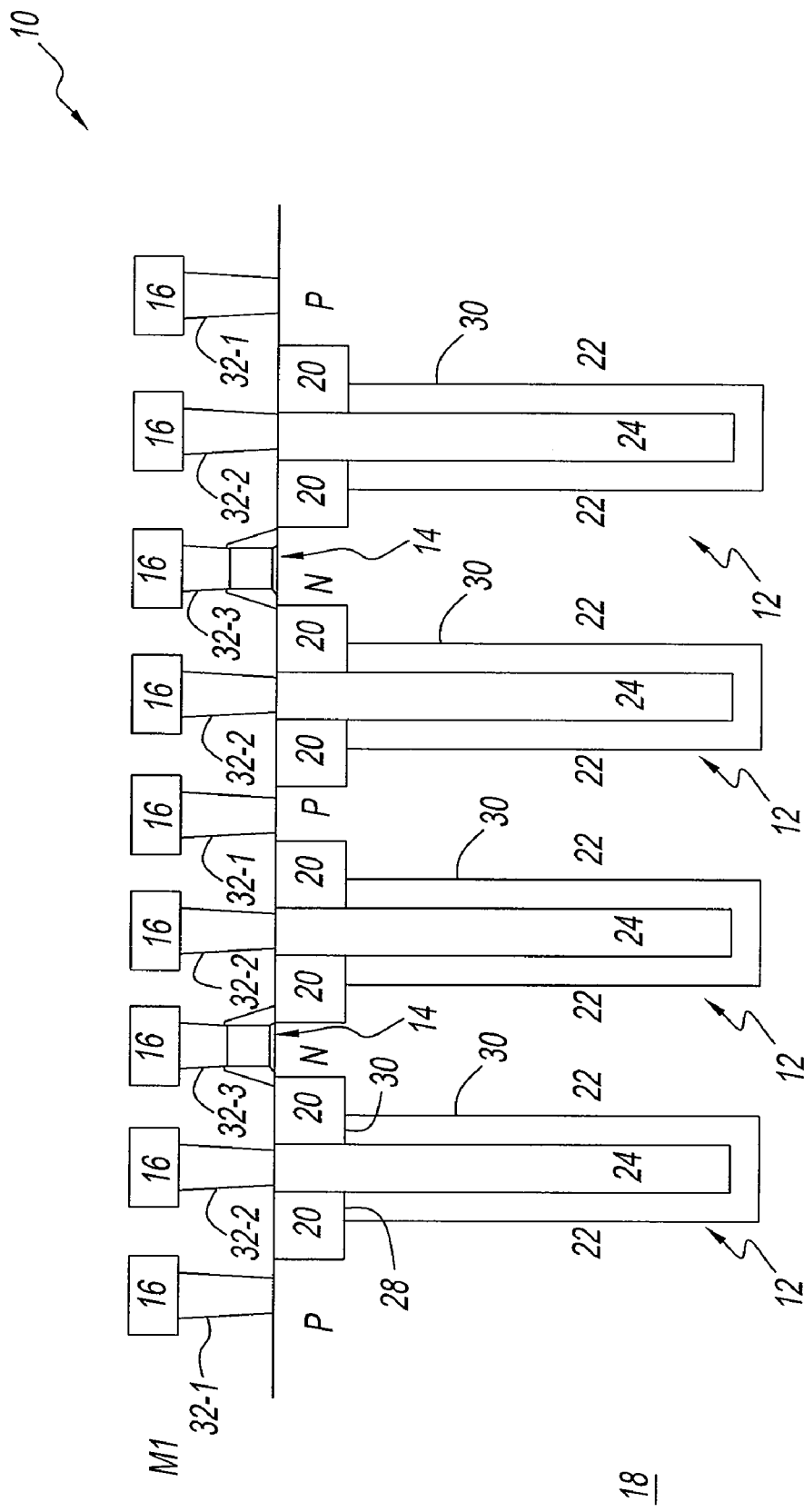
FIG. 2 is a partial sectional view of the circuit of FIG. 1 taken along lines 2-2.

Referring to the drawings and in particular to FIGS. 1 and 2, an exemplary embodiment of complementary metal oxide semiconductor (CMOS) circuit according to the present disclosure is illustrated by way of reference numeral 10. Advantageously, circuit 10 includes one or more deep trench capacitors 12 and one or more planar capacitors 14. The combination of capacitors 12 and 14 integrated in an inter-distributed fashion provide circuit 10 with a larger capacitance density than previously possible. Further, circuit 10 uses the same metal wire layer 16 for connecting both capacitors 12, 14 at the same time.

In the illustrated embodiment, planar capacitors 14 are shown as n-type capacitors (NCAPS). However, it is contemplated by the present disclosure for capacitors 14 to be any front-end-of-line (FEOL) capacitor such as, but not limited to NCAP, p-type capacitors (PCAPS), metal-oxide-silicon capacitors (MOSCAPS), and others. Further, it is contemplated by the present disclosure for the planar capacitors 14 to have any desired gate oxide thickness or combination of thicknesses.

Circuit 10 includes an Si-containing semiconductor substrate 18 having deep trench capacitors 12 defined therein and planar capacitors 14 formed therein.

Illustrative examples of Si-containing materials that can be employed as substrate 18 include, but are not limited to: Si, SiGe, SiC, SiGeC, and layered semiconductors such as Si/SiGe, a silicon-on-insulator (SOI) or a SiGe-on-insulator (SGOI).

As known in the art, deep trench capacitors 12 include a shallow trench isolation (STI) region 20, a doped region 22, an inner electrode 24 within the trench, and a dielectric 26 between the doped region 22 and the inner electrode 24. STI region 20 comprises an oxide insulator such as low pressure TEOS (tetraethylorthosilicate), High Density Plasma (HDP) oxide or, like oxides and can be formed in any known manner.

Advantageously, dielectric 26 has an upper edge 28 that terminates at a lower surface 30 of STI region 20. Specifically, circuit 10 is manufactured by forming the trench and dielectric 26 for the deep trench capacitor 12 before formation of STI regions 20. Since STI region 20 is formed after formation of dielectric 26, the upper edge 28 of the dielectric terminates at the lower surface 30 of STI region 20.

Circuit 10 further includes a plurality of contact 32 defined therein and in electrical communication with metal layer 16. As shown, contacts 32-1 are in electrical communication with wiring (not shown) on the surface of substrate 18, contacts 32-2 are in electrical communication with deep trench capacitors 12, while contacts 32-3 are in electrical communication with planar capacitors 14.

In this manner, circuit 10 utilizes the same metal layer 16 formed in typical back-end-of-line (BEOL) processes to interconnect capacitors 12, 14 to capture the capacitance of both capacitors 12 and 14.

In the illustrated embodiment, deep trench capacitor 12 has a capacitance per unit area of about 60 femto-Farad per square micro-meter (fF/μm2), while NCAP 14 has a capacitance per unit area of about 10 fF/μm2. Accordingly, it has been determined by the present disclosure that integrating the deep trench and planar capacitors 12, 14 provides for approximately a ten percent increase in capacitance density over circuits having only deep trench capacitor 12.

The terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. An on-chip decoupling capacitor structure, comprising:
   at least one deep trench capacitor;
   at least one planar capacitor; and
   a metal layer interconnecting said deep trench and planar capacitors, wherein said at least one deep trench capacitor comprises a shallow trench isolation region, a doped region, an inner electrode, and a dielectric between said doped region and said inner electrode.

2. The structure of claim 1, wherein said at least one planar capacitor is selected from the group consisting of an n-type capacitor, p-type capacitor, a metal-oxide-silicon capacitor, and any combinations thereof.

3. The structure of claim 1, wherein said at least one planar capacitor comprises a preselected gate oxide thickness or combination of thicknesses.

4. The structure of claim 1, wherein said shallow trench isolation region comprises an oxide insulator.

5. The structure of claim 4, wherein said oxide insulator comprises low pressure TEOS (tetraethylorthosilicate), High Density Plasma (HDP) oxide, like oxides, and any combinations thereof.

6. The structure of claim 1, wherein said dielectric has an upper edge that terminates at a lower surface of said shallow trench isolation region.

7. An on-chip decoupling capacitor structure, comprising:
   at least one deep trench capacitor having a shallow trench isolation region, a doped region, an inner electrode, and a dielectric between said doped region and said inner electrode, said dielectric having an upper edge that terminates at a lower surface of said shallow trench isolation region;
   a metal layer in electrical communication with said at least one deep trench capacitor; and
   at least one planar capacitor, said metal layer interconnecting said deep trench and planar capacitors.

8. The structure of claim 7, wherein said shallow trench isolation region comprises an oxide insulator.

9. The structure of claim 8, wherein said oxide insulator comprises low pressure TEOS (tetraethylorthosilicate), High Density Plasma (HDP) oxide, like oxides, and any combinations thereof.

10. The structure of claim 7, wherein said at least one planar capacitor is selected from the group consisting of an n-type capacitor, p-type capacitor, a metal-oxide-silicon capacitor, and any combinations thereof.

11. The structure of claim 7, wherein said at least one planar capacitor comprises a preselected gate oxide thickness or combination of thicknesses.

12. An on-chip decoupling capacitor structure, comprising:
   a first contact in electrical communication with wiring on a surface of a substrate;
   a deep trench capacitor in said substrate, said deep trench capacitor in electrical communication with a second contact;
   an n-type capacitor in said substrate, said n-type capacitor in electrical communication with a third contact; and
   a back-end-of-line metal layer interconnecting said first, second, and third contacts.

13. The structure of claim 12, wherein said deep trench capacitor comprises a shallow trench isolation region, a doped region, an inner electrode, and a dielectric between said doped region and said inner electrode.

14. The structure of claim 13, wherein said shallow trench isolation region comprises an oxide insulator.

15. The structure of claim 14, wherein said oxide insulator comprises low pressure TEOS (tetraethylorthosilicate), High Density Plasma (HDP) oxide, like oxides, and any combinations thereof.

16. The structure of claim 13, wherein said dielectric has an upper edge that terminates at a lower surface of said shallow trench isolation region.

17. The structure of claim 12, further comprising at least one planar capacitor in said substrate, said at least one planar capacitor in electrical communication with a fourth contact, wherein said back-end-of-line metal layer interconnects said first, second, third, and fourth contacts.

18. The structure of claim 17, wherein said at least one planar capacitor is selected from the group consisting of an n-type capacitor, p-type capacitor, a metal-oxide-silicon capacitor, and any combinations thereof.

* * * * *